United States Patent [19]
Lee et al.

[11] Patent Number: 6,080,615
[45] Date of Patent: Jun. 27, 2000

[54] METHOD FOR FORMING A SEMICONDUCTOR DEVICE INCORPORATING A DUMMY GATE ELECTRODE

[75] Inventors: Chang-Jae Lee, Chungcheongbuk-do; Jun-Ki Kim, Seoul, both of Rep. of Korea

[73] Assignee: LG Semicon Co., Ltd., Chungcheongbuk-Do, Rep. of Korea

[21] Appl. No.: 09/002,679

[22] Filed: Jan. 5, 1998

[30] Foreign Application Priority Data

Mar. 17, 1997 [KR] Rep. of Korea .................. 97-8970

[51] Int. Cl.⁷ .............................................. H01L 21/8242
[52] U.S. Cl. .......................... 438/239; 438/251; 257/296
[58] Field of Search ................................. 438/253, 396, 438/384, 14, 182, 234

[56] References Cited

U.S. PATENT DOCUMENTS

| | | | |
|---|---|---|---|
| 4,931,407 | 6/1990 | Maeda et al. | 438/234 |
| 5,173,437 | 12/1992 | Chi | 438/253 |
| 5,338,701 | 8/1994 | Hsu et al. | 438/210 |
| 5,470,775 | 11/1995 | Nariani | 438/384 |
| 5,500,387 | 3/1996 | Tung et al. | 438/384 |
| 5,652,157 | 7/1997 | Makoto et al. | 438/182 |
| 5,670,410 | 9/1997 | Pan | 438/14 |
| 5,683,931 | 11/1997 | Takahashi | 438/253 |
| 5,686,329 | 11/1997 | Chang et al. | 438/253 |
| 5,804,488 | 9/1998 | Shih | 438/396 |

*Primary Examiner*—Wael Fahmy
*Assistant Examiner*—William David Coleman
*Attorney, Agent, or Firm*—Morgan, Lewis & Bockius LLP

[57] ABSTRACT

A method for fabricating an integrated circuit includes the steps of forming an isolating insulation film on a portion of a semiconductor substrate, forming a gate insulating film, a first conductive layer, an insulating film and a second conductive layer successively on the semiconductor substrate including the isolating insulation film, selectively removing the second conductive layer and the insulating film to pattern an upper electrode of a capacitor in a capacitor forming region and a dummy gate electrode in a transistor forming region, respectively, forming a lower electrode mask in the capacitor forming region, and selectively removing the first conductive layer and the gate insulating film by using the lower electrode mask and the dummy gate electrode as masks, to form a lower electrode of the capacitor and the gate electrode of the transistor.

15 Claims, 7 Drawing Sheets

METHOD FOR FORMING A SEMICONDUCTOR DEVICE INCORPORATING A DUMMY GATE ELECTRODE

This application claims the benefit of Korean Application No. 8970/1997 filed on Mar. 17, 1997, which is hereby incorporated by reference.

BACKGROUND OF THE INVENTION

1. Field of the Invention

The present invention relates to a method for fabricating a semiconductor device having capacitors, and more particularly, to a method for fabricating an integrated circuit (IC) to be used for communication application, which can process a radio frequency signal.

2. Discussion of the Related Art

With the rapid development of the communication market, there have been many developments of related semiconductor devices. So far, the developments of semiconductor devices for communication field have been mostly based on chemical semiconductors, such as GaAs which is operative at a high speed and has an excellent radio frequency characteristic. Also, so far the emphasis has been on performance since the market has been small. However, the rapid growth of the communication market following the development of new communication and personal radio communication means has led to research and studies focused on low cost personal communication devices. Accordingly, instead of chemical semiconductor devices with high cost and unsophisticated high density device packing techniques, development of silicon semiconductor devices for communication applications becomes important.

Because of the development of device packing techniques and various other new techniques, there have been significant improvements in speed and radio frequency processing techniques of the silicon semiconductor devices. Accordingly, it is possible to fabricate semiconductor devices by using micronization line width techniques, CMOS circuit designing techniques, and silicide and salicide forming techniques with reduced contact resistance between wiring and substrate and reduced line resistance.

Unlike general CMOS circuits, a communication application RF semiconductor device requires integration of capacitors and inductors in addition to transistors, thus requiring new processing and integrating techniques. As a result, even though the current DRAM and logical device fabrication techniques improve the performance of the communication application RF semiconductor devices to some extent, a technique in which new unitary elements of capacitors and coils are connected to, and integrated with, the current devices becomes very important in fabrication of the communication application RF integrated circuit (IC).

A conventional method for fabricating a communication application RF integrated circuit will now be explained with reference to the attached drawings. FIGS. 1a~1b are plane views showing the steps of the conventional method, and FIGS. 2a~2g are sectional views showing the steps of the conventional method.

Referring to FIG. 2a, an isolating oxide film 2 is formed on a silicon substrate 1 for electrical insulation between an active region and a unit cell, and a gate insulating film 3 is grown to a thickness of about 80Å on the entire surface by thermal oxidation. Then, a first conductive layer 4 of phosphorous doped polysilicon, which is to be used to form a gate electrode of a transistor and a lower electrode of a capacitor, is deposited to a thickness of about 2000Å on the entire surface by low pressure chemical vapor deposition (LPCVD). An insulating film 5 of silicon oxide, which is to be used as a cap insulating film of the transistor and a dielectric layer of the capacitor, is deposited on the first conductive layer 4 to a thickness of about 700Å.

Referring to FIG. 2b, a second conductive layer 6, which is to be used as an upper electrode of the capacitor, is deposited on the insulating film 5 to a thickness of about 2000Å by LPCVD. Referring to FIGS. 1a and 2c, a first photoresist film 7 is formed on the second conductive layer 6 and subjected to exposure and development to define a portion which is to be the upper electrode of the capacitor. Referring to FIG. 2d, using the first photoresist film 7 as a mask, portions of the second conductive layer 6 and the insulating film 5 are selectively removed to form the upper electrode 6a of the capacitor.

Referring to FIG. 2e, the first photoresist film 7 is removed and a second photoresist film 8 is deposited on the entire surface. Referring to FIGS. 1b and 2f, the second photoresist film 8 is subjected to exposure and development to define a capacitor region and a gate region of the transistor, and the remaining photoresist film 8 is then used as a mask in selectively removing exposed portions of the first conductive layer 4 and the gate insulating film 3 to form the lower electrode 6b of the capacitor and the gate electrode 9 of the transistor.

Referring to FIG. 2g, the second photoresist film 8 is removed. An insulating film (a CVD oxide film) is deposited and subjected to anisotropic etching to form sidewall insulating films 10 at sides of upper and lower electrodes 6a and 6b of the capacitor. The sidewall insulating films 10 are also formed at sides of the gate electrode 9 of the transistor. Then, by using the gate electrode 9 of the transistor as a mask, impurity ions are implanted into the active region and the substrate to form source/drain regions 11 of the transistor.

However, the conventional method for fabricating a communication application IC has the following problems. To form the gate of the transistor and the lower electrode of the capacitor, steps are formed during the deposition and exposure of the second photoresist film. This causes inconsistency in focus depths, thereby making it difficult to form an exact and uniform pattern.

SUMMARY OF THE INVENTION

Accordingly, the present invention is directed to a method for fabricating a communication application IC that substantially obviates one or more of the problems due to limitations and disadvantages of the related art.

An object of the present invention is to provide a method for fabricating an IC for communication which is capable of eliminating inconsistencies of gate patterns, thus providing a greater allowance in the fabrication process. Another object of the present invention is to establish a stable IC fabricating technique and improve reliability of the device.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method for fabricating an integrated circuit for use in communication, includes the steps of forming an isolating insulation film on a semiconductor substrate for isolating between cells, forming a gate insulating film, a first conductive layer, an insulating film and a second conductive layer in succession on the entire surface of the semiconductor substrate, selectively removing the second conductive layer and the insulating film to pattern an upper electrode of a capacitor and a dummy gate electrode in a capacitor forming region and a transistor forming region respectively, and selectively removing exposed portions of the first conductive layer and the gate insulating film with a lower electrode forming region of the capacitor masked and the dummy gate electrode used as a mask, to form a lower electrode of the capacitor and the gate electrode of the transistor.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiment of the present invention, examples of which are illustrated in the accompanying drawings.

FIGS. 3a~3e are plane views showing the steps of a method for fabricating a communication application RF integrated circuit in accordance with one embodiment of the present invention, and FIGS. 4a~4e are sectional views showing the steps of the same method.

Figure 1A:
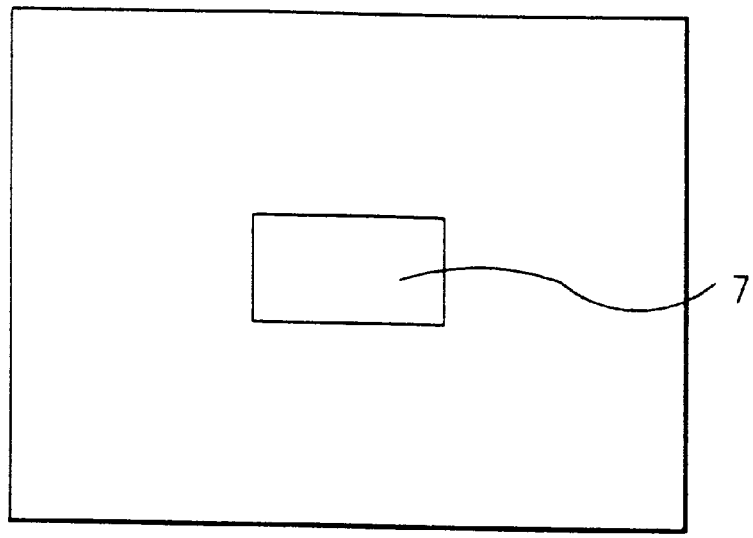
FIGS. 1a~1b are plane views showing the steps of a conventional method for fabricating a communication application RF integrated circuit.
Figure 1B:
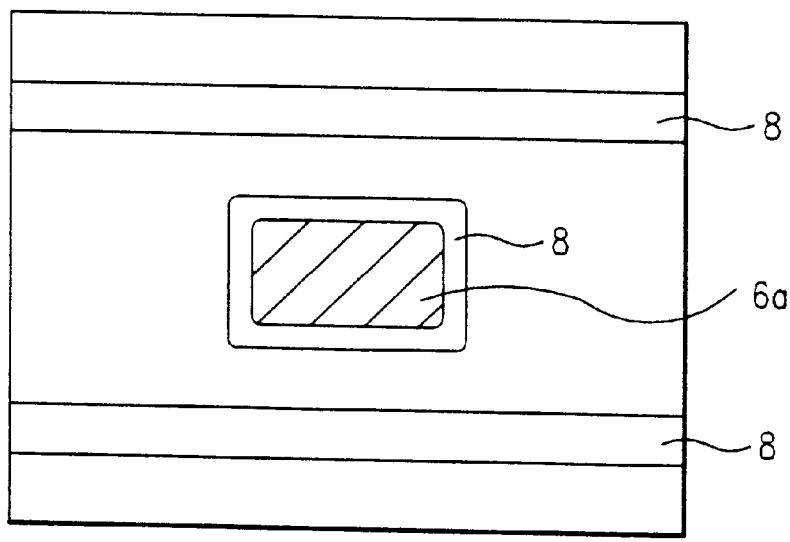
Figure 2A:
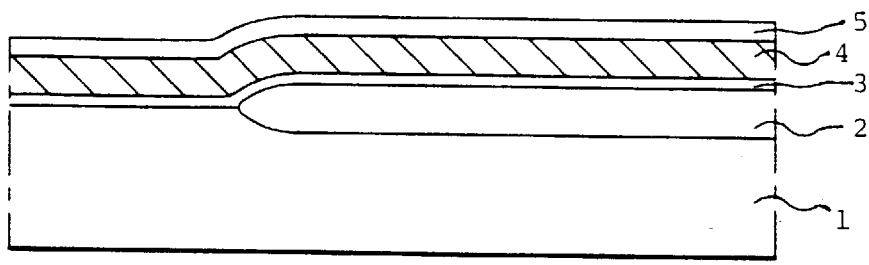
FIGS. 2a~2g are sectional views showing the steps of the conventional method for fabricating the communication application RF integrated circuit.
Figure 2B:
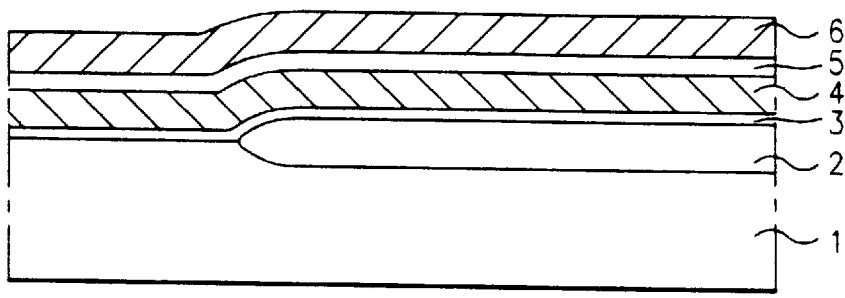
Figure 2C:
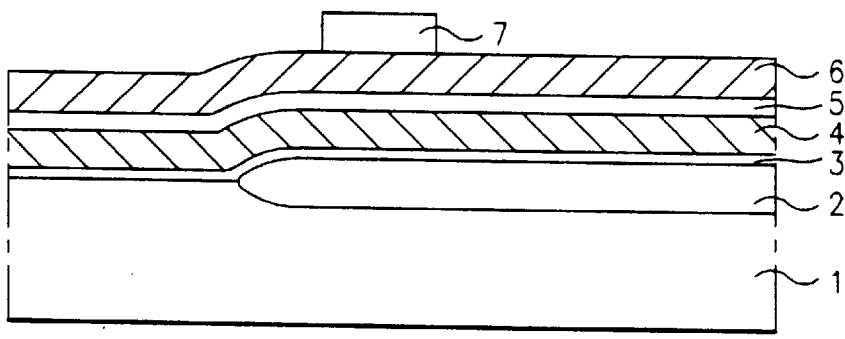
Figure 2D:
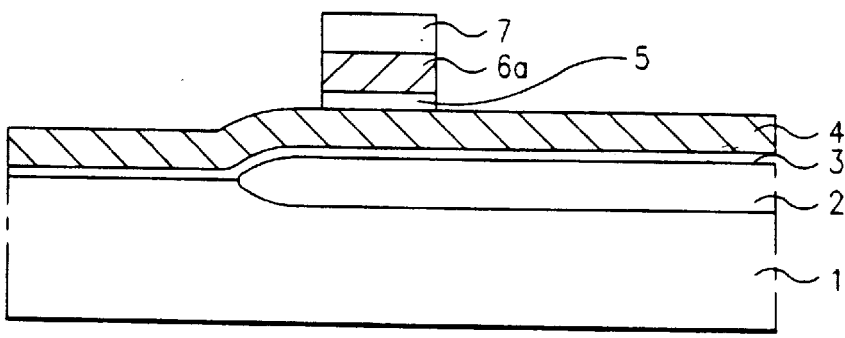
Figure 2E:
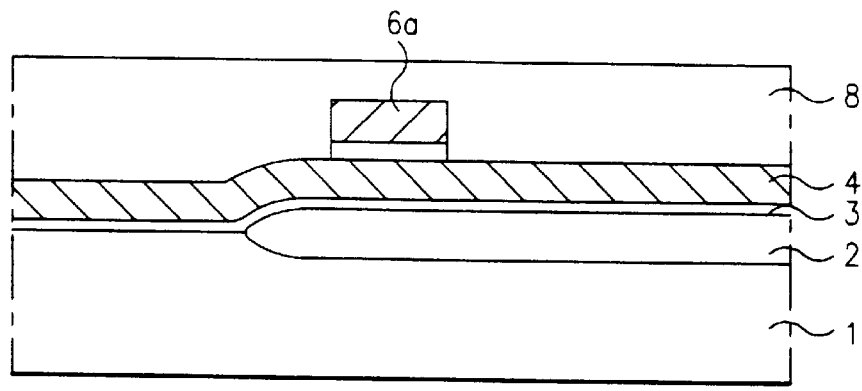
Figure 2F:
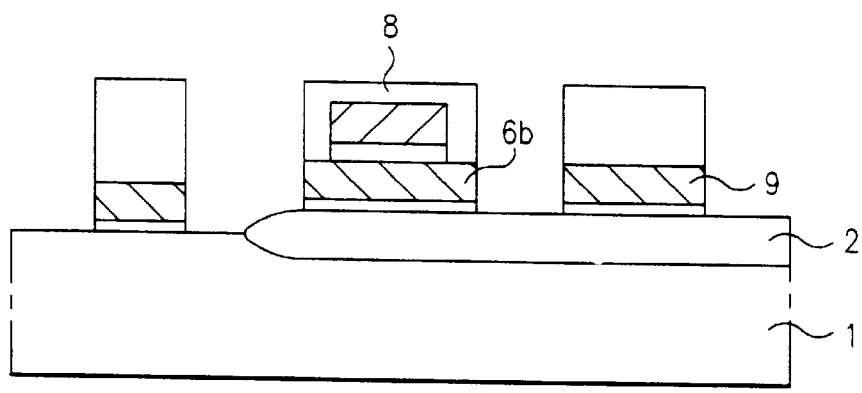
Figure 2G:
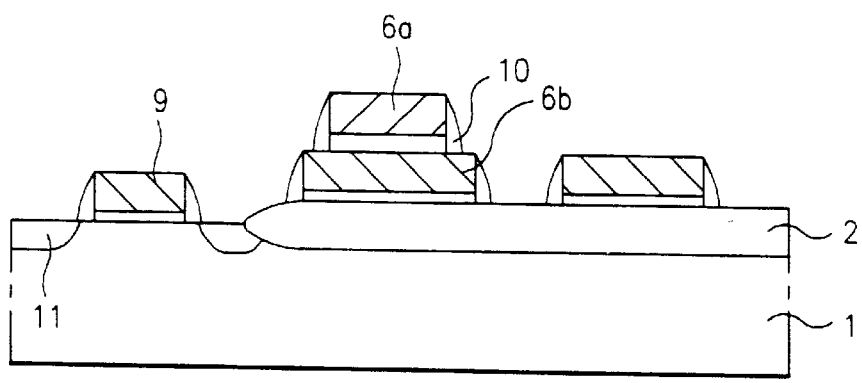
Figure 3A:
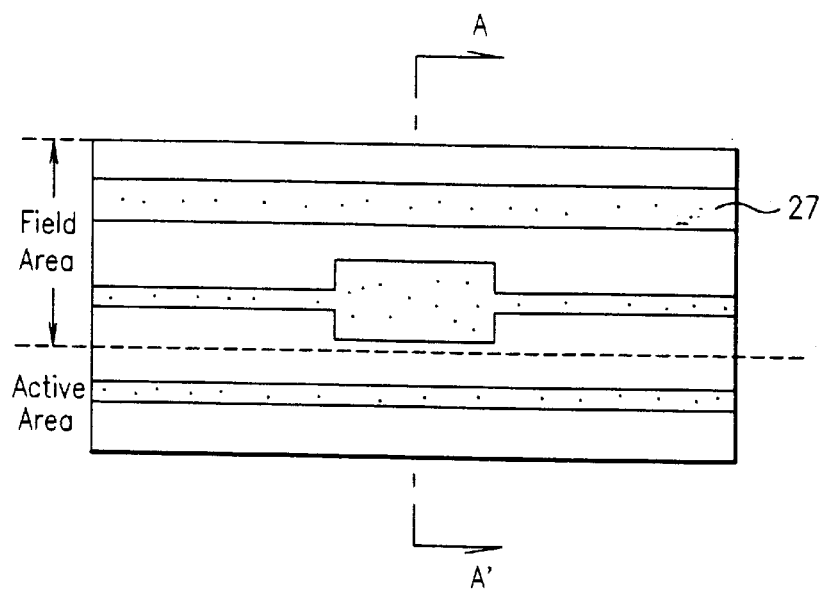
FIGS. 3a~3e are plane views showing the steps of a method for fabricating a communication application RF integrated circuit in accordance with one embodiment of the present invention.
Figure 4A:
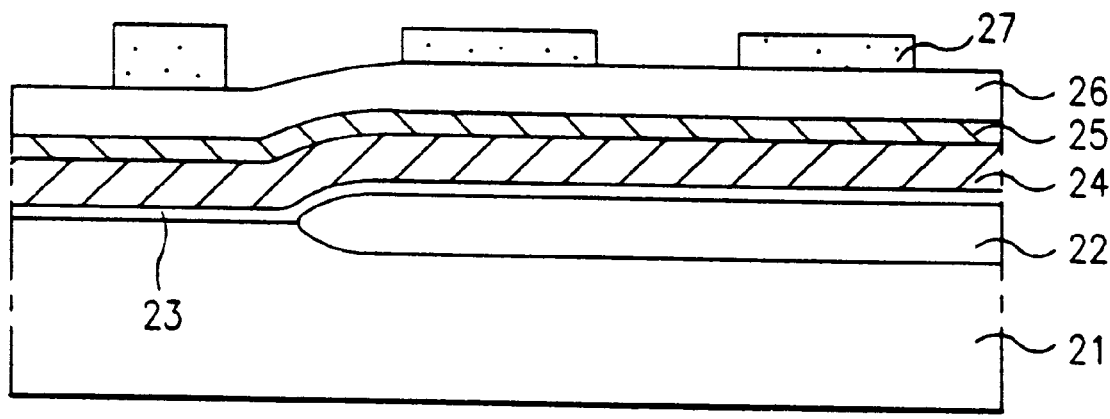
FIGS. 4a~4e are sectional views showing the steps of the method of FIGS. 3a~3e for fabricating a communication application RF integrated circuit.

Referring to FIGS. 3a and 4a, an isolating oxide film 22 is formed on a silicon substrate 21 to provide electrical insulation between an active region and a unit cell. A gate insulating film 23 is grown on the entire surface of the substrate 21 and the isolating oxide film 22. The gate insulating film 23 is grown to a thickness of about 60~100Å (preferably 80Å) by thermal oxidation. Then, a first conductive layer 24 of phosphorous doped polysilicon, which is to be used as a gate electrode of a transistor and a lower electrode of a capacitor, is deposited to a thickness of about 1500~2500Å (preferably 2000Å) on the entire surface by LPCVD. An insulating film 25 of silicon oxide, which is to be used as a cap insulating film of the transistor and a dielectric layer of the capacitor, is deposited on the first conductive layer 24 to a thickness of about 500~900Å (preferably 700Å). A second conductive layer 26, which is to be used as an upper electrode of the capacitor, is deposited on the insulating film 25 to a thickness of about 1500~2500Å (preferably 2000Å) by LPCVD. A first photoresist film 27 is deposited on the second conductive layer 26 and subjected to exposure and development to define portions where the upper electrode of the capacitor and the gate electrode of the transistor are to be formed.

Figure 3B:
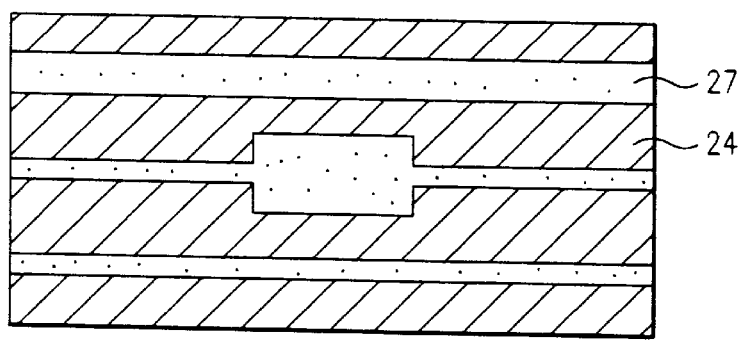
Figure 4B:
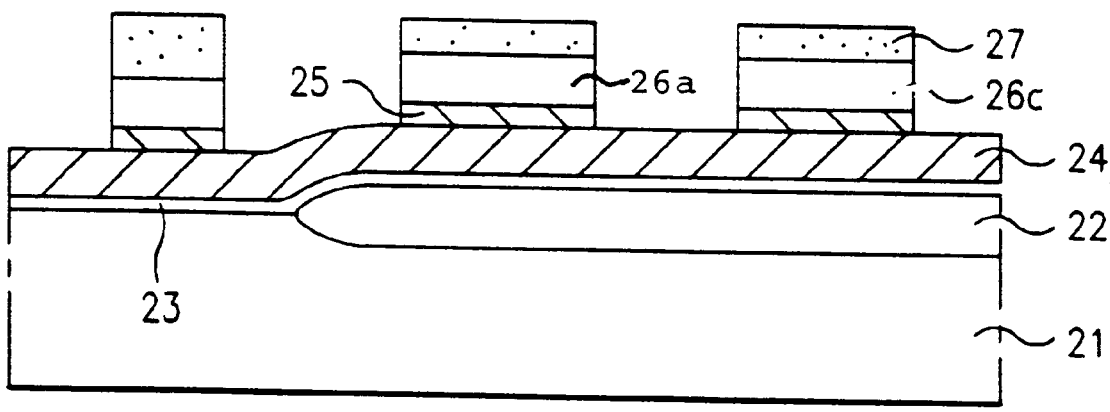

Referring to FIGS. 3b and 4b, portions of the second conductive layer 26 and the insulating film 25, which are not covered by the first photoresist film 27, are selectively removed to form the upper electrode 26a of the capacitor. Here, although the patterned second conductive layer 26 is not the actual gate electrode of the transistor, the second conductive layer 26 is patterned in the active region into a form similar to the gate electrode of the transistor (hereafter referred to as "dummy gate electrode 26c"). The actual gate electrode of the transistor is to be formed later.

Figure 3C:
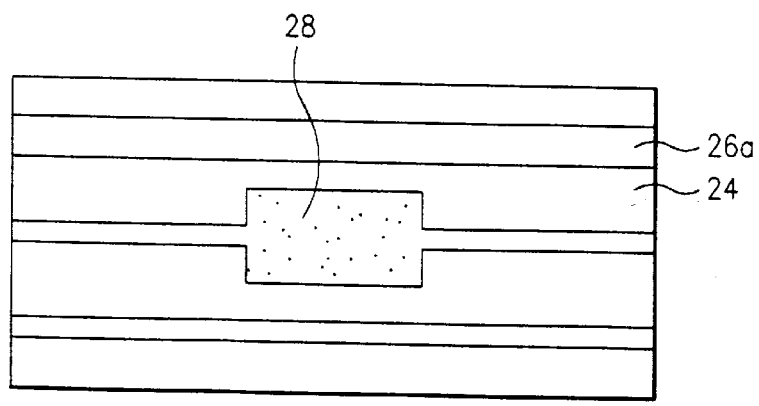
Figure 4C:
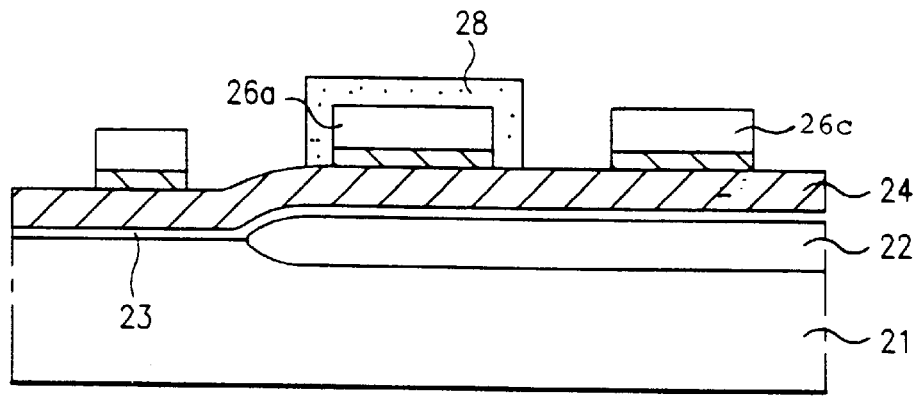

Referring to FIGS. 3c and 4c, the first photoresist film 27 is removed, and a second photoresist film 28 is deposited on the entire surface and subjected to exposure and development to define a lower electrode forming region of the capacitor. In this instance, the dummy gate electrode 26c of the transistor is exposed.

Figure 3D:
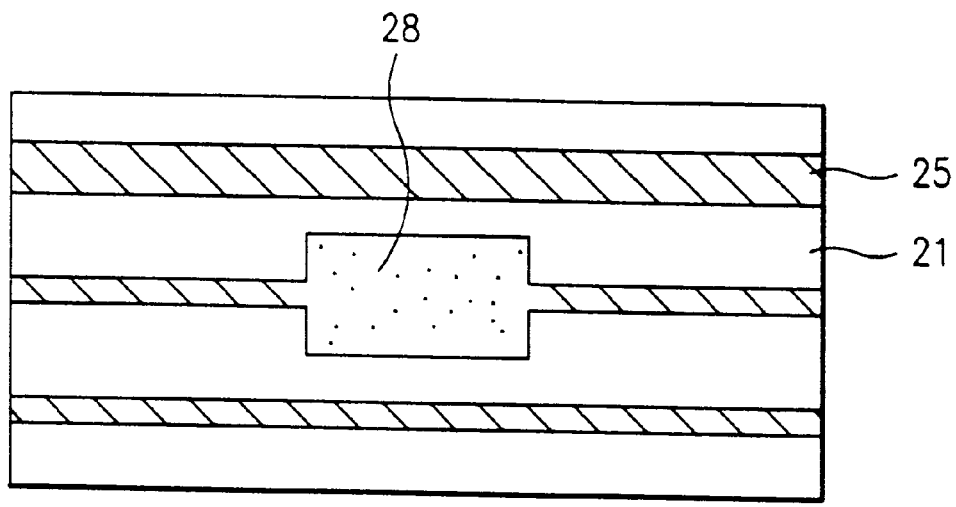
Figure 4D:
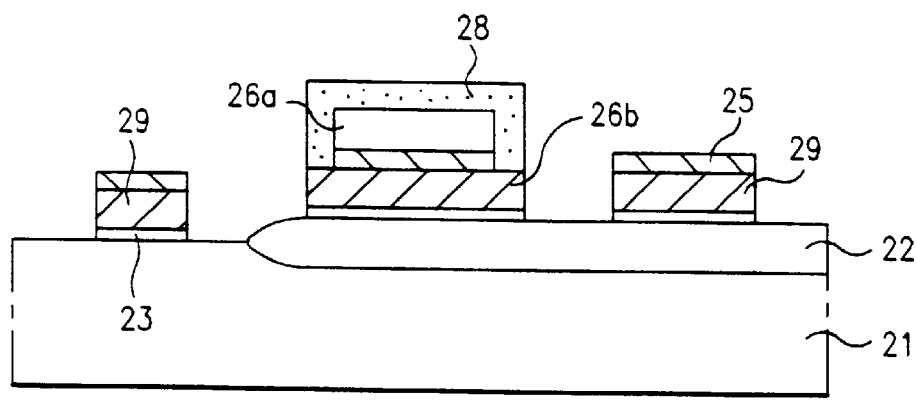

Referring to FIGS. 3d and 4d, the second photoresist film 28 and the dummy gate electrode 26c of the transistor are used as masks in selectively removing exposed portions of the first conductive layer 24 and the gate insulating film 23 to form the lower electrode 26b of the capacitor and the gate electrode 29 of the transistor. Thereafter, even though the dummy gate electrode 26c is removed, the insulating film 25 is not removed.

Figure 3E:
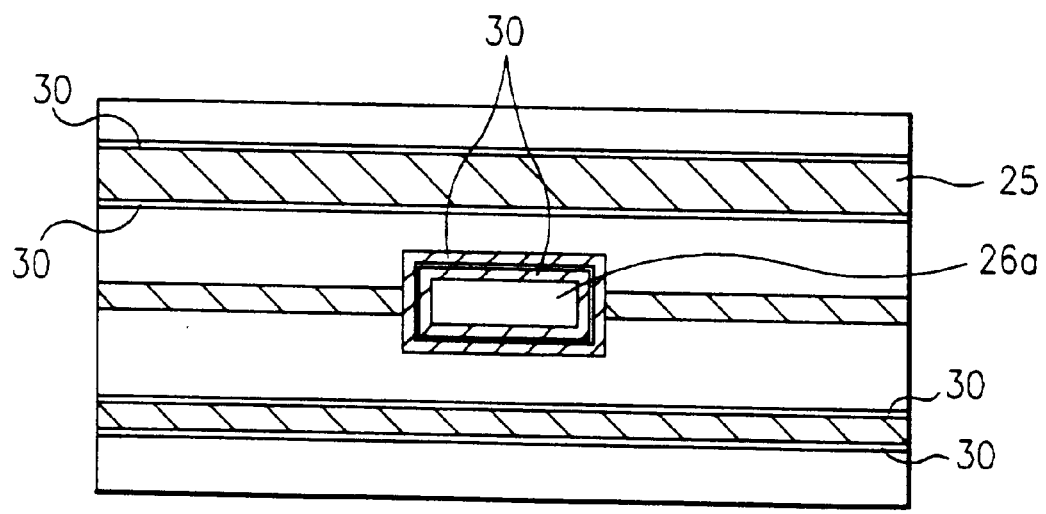
Figure 4E:
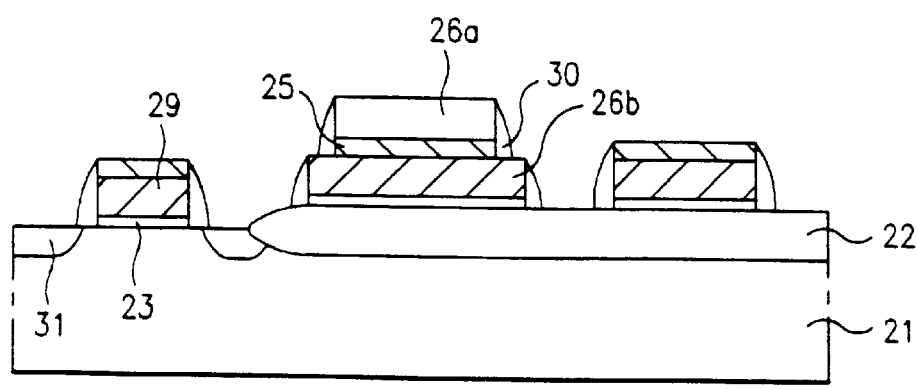

Referring to FIGS. 3e and 4e, the second photoresist film 28 is removed, and an insulating film (e.g., a CVD oxide film) is deposited on the entire surface and subjected to anisotropic etching to form sidewall insulating films 30 at sides of the upper electrode 26a and the lower electrode 26b of the capacitor and at sides of the gate electrode 29 of the transistor. Although not shown, the gate electrode 29 of the transistor is used as a mask for impurity ion implantation into portions of the substrate in the active region to form source/drain regions 31 of the transistor.

The method for fabricating a communication application IC has the following advantage. Because of the simultaneous formation of the upper electrode of the capacitor and the gate electrode pattern of the transistor, no steps are formed between the capacitor region and the transistor region.

It will be apparent to those skilled in the art that various modifications and variations can be made in the method for fabricating an IC for use in communication of the present invention without departing from the spirit or scope of the invention. Thus, it is intended that the present invention cover the modifications and variations of this invention provided they come within the scope of the appended claims and their equivalents.

What is claimed is:

1. A method for fabricating an integrated circuit comprising the steps of:

forming an isolating insulation film on a portion of a semiconductor substrate;

forming a gate insulating film, a first conductive layer, an insulating film and a second conductive layer successively on the semiconductor substrate including the isolating insulation film;

selectively removing the second conductive layer and the insulating film to simultaneously pattern an upper electrode of a capacitor in a capacitor forming region and a dummy gate electrode of a transistor in a transistor forming region, respectively;

forming a lower electrode mask in the capacitor forming region; and selectively removing the first conductive layer and the gate insulating film by using the lower electrode mask and the dummy gate electrode as masks, to simultaneously form a lower electrode of the capacitor and a gate electrode of the transistor.

2. The method as claimed in claim 1, further comprising the steps of:

forming side insulating films at sides of the upper electrode and the lower electrode of the capacitor and at sides of the gate electrode of the transistor; and forming source/drain regions of the transistor in the substrate in an active region.

3. The method as claimed in claim 2, wherein the step of forming source/drain regions include implanting impurity ions by using the gate electrode of the transistor as a mask.

4. The method as claimed in claim 1, wherein the gate insulating film is formed to a thickness of approximately 60~100Å by thermal oxidation.

5. The method as claimed in claim 1, wherein each of the first and second conductive layers is formed to a thickness of approximately 1500~2500Å by low pressure chemical vapor deposition.

6. The method as claimed in claim 1, wherein the insulating film is formed to a thickness of approximately 500~900Å.

7. The method as claimed in claim 1, wherein the isolating insulation film performs an isolation function between cells of the integrated circuit.

8. A method for fabricating an integrated circuit on a semiconductor substrate divided into a capacitor forming region and a transistor forming region, comprising the steps of:

forming a first insulating film, a first conductive layer, a second insulating film, and a second conductive layer successively on the semiconductor substrate;

selectively removing the second conductive layer and the second insulating film to form an upper electrode of a capacitor in the capacitor forming region, and a dummy gate electrode in the transistor forming region;

selectively removing the first conductive layer and the first insulating film to form a lower electrode of the capacitor and a gate electrode of the transistor.

9. The method as claimed in claim 8, prior to the step of selectively removing the first conductive layer and the first insulating film, further comprising the step of forming a lower electrode mask around the upper electrode of the capacitor in the capacitor forming region.

10. The method as claimed in claim 9, wherein the step of selectively removing the first conductive layer and the first insulating film is carried out by using the lower electrode mask and the dummy gate electrode as masks.

11. The method as claimed in claim 8, further comprising the step of forming insulating side walls at sides of the upper electrode and the lower electrode of the capacitor and at sides of the gate electrode of the transistor.

12. The method as claimed in claim 8, further comprising the step of forming source/drain regions of the transistor in the substrate in an active region of the transistor forming region by using the gate electrode of the transistor as a mask.

13. The method as claimed in claim 8, wherein the first insulating film is formed to a thickness of a approximately 60~100Å by thermal oxidation.

14. The method as claimed in claim 8, wherein each of the first and second conductive layers is formed to a thickness of approximately of 1500~2500Å by low pressure chemical vapor deposition.

15. The method as claimed in claim 8, wherein the second insulating film is formed to a thickness of approximately 500~900Å.

* * * * *